United States Patent
Yamaki et al.

(10) Patent No.: US 6,982,441 B2
(45) Date of Patent: Jan. 3, 2006

(54) SEMICONDUCTOR DEVICE WITH A SUPER LATTICE BUFFER

(75) Inventors: Fumikazu Yamaki, Yamanashi (JP); Takeshi Igarashi, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 10/035,444

(22) Filed: Jan. 4, 2002

(65) Prior Publication Data

US 2002/0088994 A1 Jul. 11, 2002

(30) Foreign Application Priority Data

Jan. 10, 2001 (JP) .............................. 2001-003069

(51) Int. Cl.
*H01L 31/0328* (2006.01)

(52) U.S. Cl. ..................... 257/192; 257/15; 257/20; 257/24; 257/190; 257/194; 257/197
(58) Field of Classification Search ................ 257/103, 257/96, 97, 99, 13, 749, 15, 20, 24, 190, 257/192, 194, 195, 197, 198, 280, 281; 372/43; 438/149, 769
See application file for complete search history.

(56) References Cited

U.S. PATENT DOCUMENTS 5,373,191 A * 12/1994 Usagawa et al. ............ 257/773
5,430,310 A * 7/1995 Shibasaki et al. ........... 257/190
5,798,537 A * 8/1998 Nitta ........................... 257/103
6,294,446 B1 * 9/2001 Ishikawa ..................... 438/579
6,462,361 B1 * 10/2002 Udagawa et al. ........... 257/194

FOREIGN PATENT DOCUMENTS

| JP | 62012119 A | 1/1987 |
|---|---|---|
| JP | 06151473 A | 5/1994 |
| JP | 06-349858 A | 12/1994 |
| JP | 08031845 A | 2/1996 |
| JP | 10-56168 | 2/1998 |
| JP | 10-112444 | 4/1998 |
| JP | 11-68086 | 3/1999 |
| JP | 11-186291 | 7/1999 |
| JP | 2000256099 A | 9/2000 |
| JP | 2002176169 A | 6/2002 |

* cited by examiner

*Primary Examiner*—Minhloan Tran
*Assistant Examiner*—Tan Tran
(74) *Attorney, Agent, or Firm*—Armstrong, Kratz, Quintos, Hanson & Brooks, LLP

(57) ABSTRACT

A semiconductor device includes a compound semiconductor substrate having a resistivity less than $1.0 \times 10^8$ Ohm-cm at least at one surface thereof, a buffer layer formed on the compound semiconductor substrate and having a super lattice structure, and an active layer formed on the buffer layer and having an active element formed therein.

26 Claims, 12 Drawing Sheets

Ids : 500mA/div.
Vds : 2V/div.
ΔVgs : 200mV
Idosc : 2400mA

Ids : 500mA/div.
Vds : 2V/div.
$\Delta$Vgs : 200mV
Idosc : 3400mA

SEMICONDUCTOR DEVICE WITH A SUPER LATTICE BUFFER

CROSS-REFERENCE TO RELATED APPLICATION

The present application is based on Japanese priority application No. 2001-003069 filed on Jan. 10, 2001, the entire contents of which are hereby incorporated by reference.

BACKGROUND OF THE INVENTION

The present invention generally relates to semiconductor devices and more particularly to a high speed compound semiconductor device having a super lattice buffer.

In compound semiconductor devices, an active layer or a channel layer is formed by using a compound semiconductor, in which electron mobility is high, to attain high speed operation. Therefore, the compound semiconductor devices are important to high speed radio communication network systems employing GHz bands, including cellular phone service systems, and especially high power compound semiconductor devices are desired for base stations of such high speed radio communication networks.

FIG. 1 shows the structure of a conventional MESFET 10 used as an output transistor at the final stage in a base station of a high-speed radio communication network system.

Referring to FIG. 1, the MESFET 10 is formed on a semi-insulating GaAs substrate 11, and includes an undoped GaAs buffer layer 12 formed epitaxially on the GaAs substrate 11, and an n-type GaAs channel layer 13 formed epitaxially on the buffer layer 12. On the channel layer 13 is formed a gate electrode 14G which corresponds to a channel region. A source electrode 14S and a drain electrode 14D are formed on opposite sides of the gate electrode 14G respectively, as shown in FIG. 1.

FIG. 2 is a chart illustrating the characteristic curves of drain-source currents Ids versus drain-source voltages Vds of the MESFET 10 of FIG. 1. In this chart, a gate-source voltage Vgs is varied incrementally by 200 mV each incremented to give many curves. The vertical axis represents the Ids of the MESFET 10 with each division on the scale equaling 500 mA, and the horizontal axis represents the drain-source voltage Vds with each division of the scale equaling 2V.

Referring to FIG. 2, the drain-source current Ids increases as the gate-source voltage Vgs increases. But after the Ids reaches the saturation region, it suddenly drops as the drain-source voltage Vds increases. It is known that this sudden drop of the saturated drain-source current Ids is due to the Gunn Effect in the MESFET. As a result, the MESFET 10 has a limitation on high frequency power that can be obtained. The chart of FIG. 2 shows the characteristic curves of the conventional MESFET 10 employing the semi-insulating GaAs substrate 11, and the substrate 11 has a high resistivity of more than $1 \times 10^8$ Ohm-cm.

When high resistance semi-insulating GaAs is used as the substrate 11 shown in FIG. 1 and a high voltage is applied to the channel layer 13, it will create multiple electric double regions comprising electron accumulation regions and electron depletion regions abutting on each other in turn. This is a domain structure and Gunn oscillation occurs.

FIG. 3 is a schematic chart illustrating the characteristic curves shown in FIG. 2 together with the load line of the MESFET 10.

Referring to FIG. 3, the actual operational region of the MESFET 10 is located in the area where the saturated drain-source current Ids suddenly drops. Accordingly, the MESFFET 10 cannot provide a desired high power output. In FIG. 3, the minimum current of the saturated drain-source current Ids in the Gunn oscillation area is represented by Idosc. The minimum saturated drain-source current Idosc is about 2400 mA in the FIG. 2 example.

Accordingly, conventional compound semiconductor devices cannot provide enough power when they are used for high power applications such as a base station output stage in high-speed radio communication systems. Various improvements in device structures have been tried in order to solve the above problems.

SUMMARY OF THE INVENTION

Accordingly, it is a general object of the present invention to provide a novel and useful semiconductor device wherein the foregoing problems are eliminated.

Another and more specific object of the present invention is to provide a high-speed semiconductor device that suppresses Gunn oscillation and can provide high power output.

Another object of the present invention is to provide a semiconductor device, comprising:

a compound semiconductor substrate having a resistivity less than $1.0 \times 10^8$ Ohm-cm at least at surface thereof;

a buffer layer formed on the compound semiconductor substrate and having a super lattice structure; and an active layer formed on the buffer layer and having an active element formed therein.

It is preferable to form the semiconductor device so that the compound semiconductor substrate has a resistivity less than $0.6 \times 10^8$ Ohm-cm. Further, it is preferable to form the semiconductor device so that the active layer is formed at a position within 5.0 µm of the surface of the compound semiconductor substrate. Further, it is preferable to have an electrode layer formed on another surface of the compound semiconductor substrate. Further, it is preferable to form the semiconductor device so that the electrode layer is not electrically connected to the semiconductor device. Further, it is preferable to form the semiconductor device so that the electrode layer is connected to one power supply potential of the semiconductor device. Further, it is preferable to have a source electrode and a drain electrode formed on the active layer separated from each other, so as to establish a channel region, and a gate electrode formed above the channel region. Further, it is preferable to form the semiconductor device so that the active layer has 2-Dimensional Electron Gasses. Further, it is preferable to form the semiconductor device so that the active layer comprises:

a collector layer of a first conducting type;

a base layer of a second conducting type formed on the collector layer;

an emitter layer of the first conducting type formed on the base layer. Further, it is preferable to form the semiconductor device so that the compound semiconductor substrate has a resistivity more than $1.0 \times 10^8$ Ohm-cm in total. Further, it is preferable to form the semiconductor device so that the compound semiconductor substrate comprises a compound semiconductor support substrate having a resistivity more than $1.0 \times 10^8$ Ohm-cm and a compound semiconductor having a resistivity less than $1.0 \times 10^8$ Ohm-cm.

The inventors of the present invention have tried to inhibit large electrical fields from being applied to the channel layer in the MESFET device 10 shown in FIG. 1, in order to restrain the Gunn Effect. For that purpose, they have used a GaAs layer having a resistivity less than $1.0 \times 10^8$ Ohm-cm as the substrate 11 and tried to alleviate the concentration of electrical fields in the channel layer 13 along a depth direction. However, in this device having a combination of a high resistance GaAs buffer layer 12 and the low resistance GaAs substrate 11, the electrical field concentration along the depth direction was truly alleviated in the channel layer 13, but electrons more easily accumulated around the interface between the buffer layer 12 and the substrate 11, as a result of the electrical field alleviation, and therefore the domain became easier to generate. Because the interface between the buffer 12 and the substrate 11 is far from the gate electrode 14G or the drain electrode 14D, a horizontal electrical field, that is an electrical field parallel to the substrate surface, became smaller, and then the electron density became higher and domains became easier to generate. This means that an ordinary high resistance GaAs buffer layer 12 cannot effectively inhibit electrons from leaking from the channel layer 13 to the low resistance substrate 11.

The inventors of the present invention, based on the above experience, have thought out a concept that in a compound semiconductor device including a MESFET device formed on a compound semiconductor substrate, a low resistance substrate can be employed as the compound semiconductor substrate, and a buffer layer having a super lattice structure can be interposed between the low resistance compound semiconductor substrate and an active layer having an active element formed therein. They found that such a device eliminates or alleviates the negative characteristics in the horizontal direction of the buffer layer and effectively inhibits the domain generation unlike a conventional GaAs bulk buffer layer.

In a semiconductor device according to the present invention, it becomes possible to alleviate the electrical field concentration in an active layer even when a large electrical voltage is applied to the semiconductor device, by employing a compound semiconductor substrate, which has a low resistivity at least at one surface thereof. Further, according to the present invention, a high resistance buffer layer having a super lattice structure is interposed between the active layer and the substrate. As a result, it becomes possible to inhibit the electrons from leaking from the active layer to the interface between the low resistance substrate and the buffer layer, and it becomes also possible to inhibit the leaking electrons from accumulating at the interface. Further, it becomes possible to effectively restrain the domain generation in the buffer layer even under high electrical field conditions, by having such a super lattice structure in the buffer layer.

Other objects and further features of the present invention will become apparent from the following detailed description when read in conjunction with the attached drawings.

DETAILED DESCRIPTION OF THE INVENTION

First Embodiment

Figure 4:
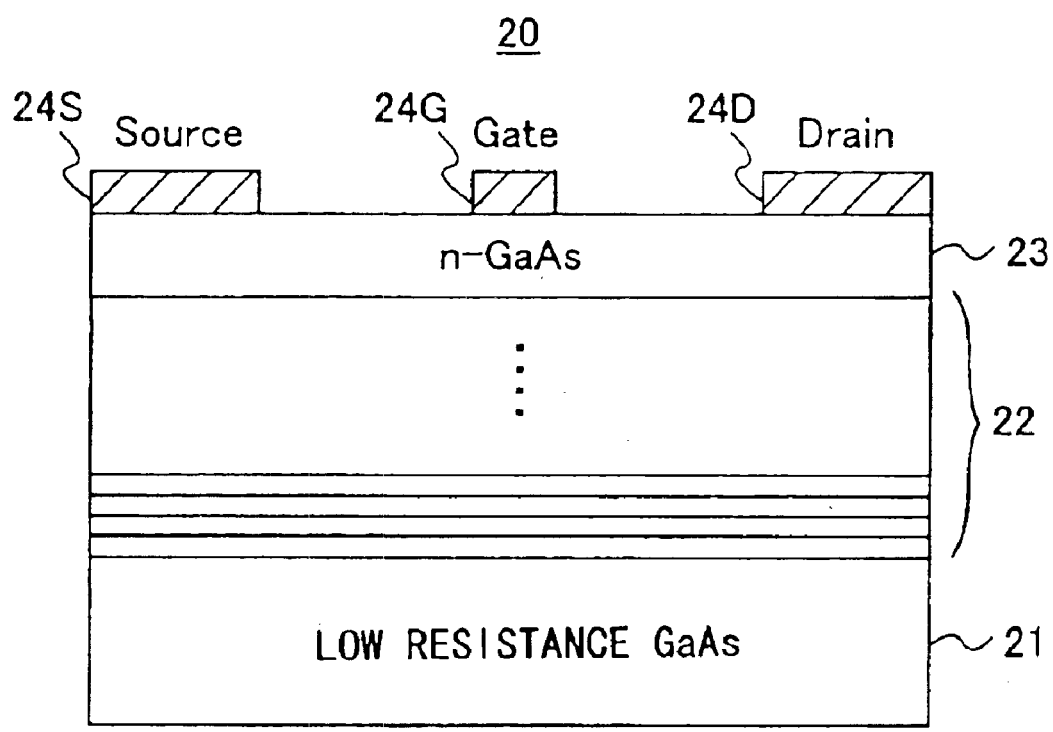
FIG. 4 is a cross-sectional view showing the construction of a MESFET device according to a first embodiment of the present invention.

FIG. 4 shows the construction of a MESFET 20 according to a first embodiment of the present invention. Referring to FIG. 4, the MESFET 20 is formed on a GaAs substrate 21 having a resistivity of $1 \times 10^8$ Ohm-cm. On the GaAs substrate 21 is formed a buffer layer 22 having a GaAs/AlGaAs super lattice structure, in which undoped GaAs layers each with a carrier concentration less than $1 \times 10^{15}$ cm$^{-3}$ and undoped AlGaAs layers each with a carrier concentration less than $1 \times 10^{16}$ cm$^{-3}$ are laminated alternatingly with the total thickness being in the range 100 nm–1 $\mu$m. In the buffer layer 22, both GaAs layers and AlGaAs layers typically have a thickness of 10–100 nm, and are formed preferably by the MOVPE method or the MBE method. The AlGaAs layers may preferably have a composition parameter x in the range 0.18–0.28 where the composition is represented by Al$_x$Ga$_{1-x}$As.

Further, on the GaAs/AlGaAs super lattice buffer 22 is formed a channel layer or an active layer 23 doped with Si to a concentration of $1 \times 10^{17}$ cm$^{-3}$ and having a thickness of about 200 nm, by using the MOVPE method or the MBE method.

A source electrode 24S and drain electrode 24D are formed on the channel layer 23 so as to be in ohmic contact with it. A gate electrode 24G is formed on a channel region of the channel layer 23 between the source electrode 24S and the drain electrode 24D so as to be in Schottky contact with the channel layer 23.

Figure 2:
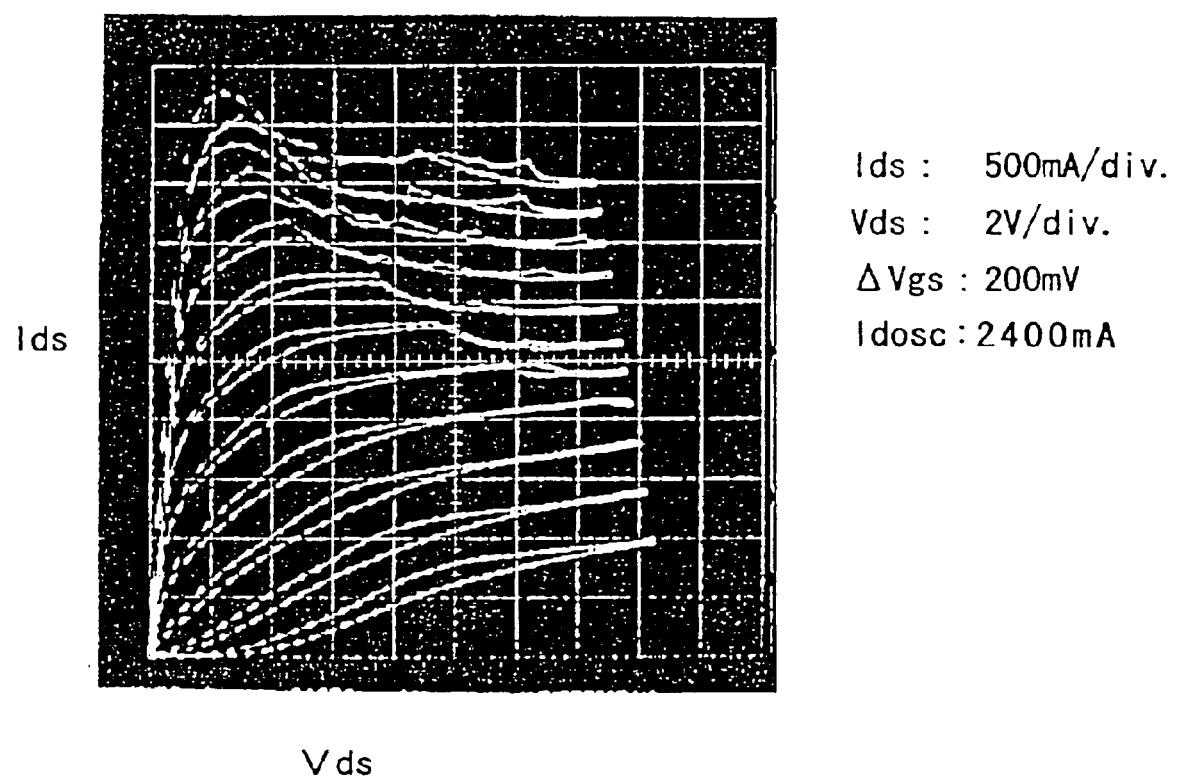
FIG. 2 shows the characteristic curves of the MESFET device shown in FIG. 1.
Figure 3:
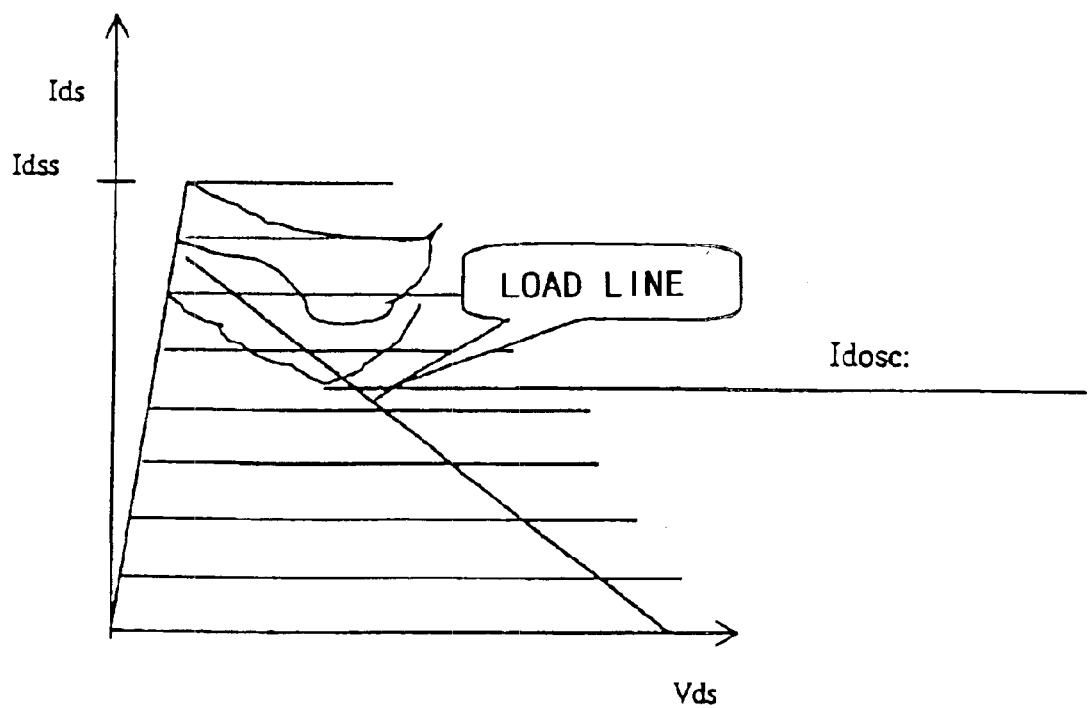
FIG. 3 shows the characteristic curves together with the load line of the MESFET device shown in FIG. 1.
Figure 5:
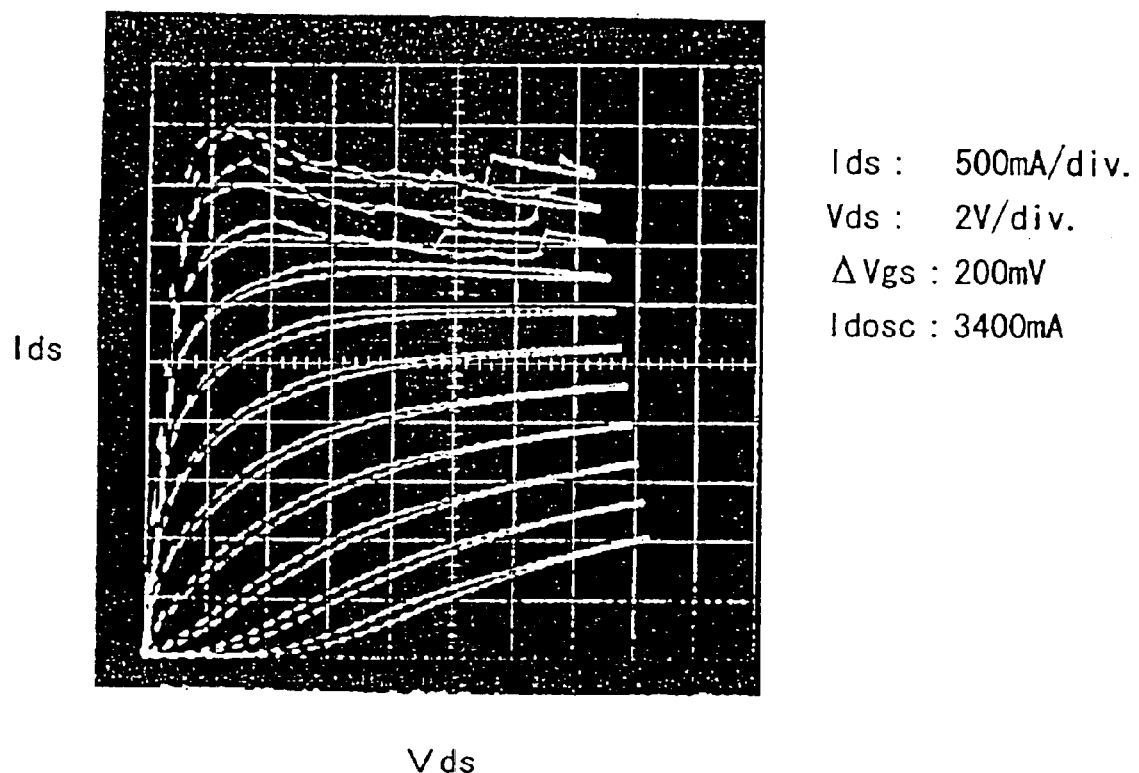
FIG. 5 shows the characteristic curves of the MESFET device shown in FIG. 4.

FIG. 5 is a chart illustrating characteristic curves of drain-source currents Ids versus drain-source voltages Vds of the MESFET 20 of FIG. 4. In this chart, a gate-source voltage Vgs is varied by 200 mV increments to give many curves. The vertical axis represents the Ids of the MESFET 20 with one division of the scale being 500 mA, and the horizontal axis represents the drain-source voltage Vds with one division of the scale being 2V, like FIG. 2.

Figure 1:
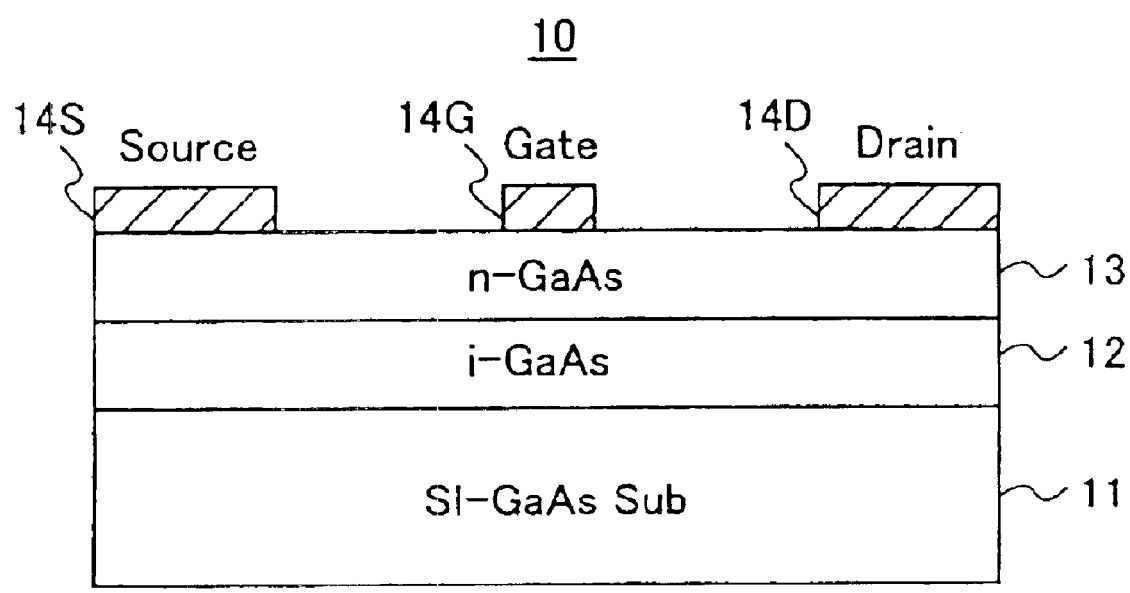
FIG. 1 is a cross-sectional view showing the construction of a conventional MESFET device.
Figure 6:
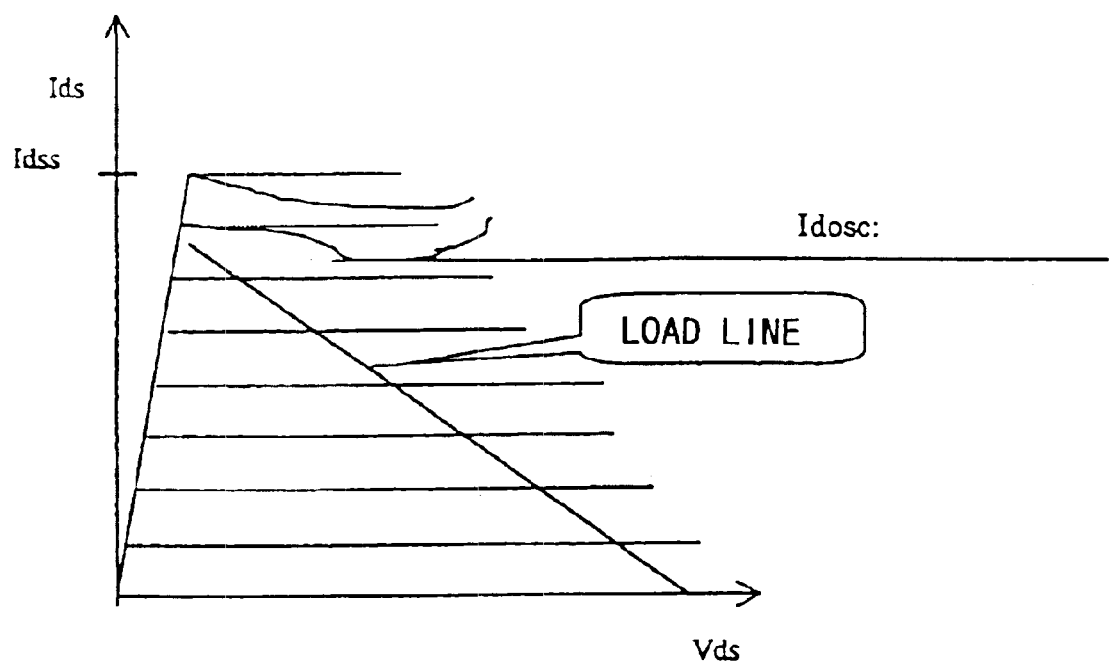
FIG. 6 shows the characteristic curves together with the load line of the MESFET device shown in FIG. 4.

Referring to FIG. 5, the drain-source current Ids increases as the gate-source voltage Vgs increases. But after the Ids reaches the saturation region, it drops as the drain-source voltage Vds increases. These drops of the saturated drain current Ids are significantly alleviated compared with the current drops in the conventional device shown in FIGS. 1 and 2. As seen from FIG. 6 illustrating the combination of the characteristic curves and the load line, the device can avoid the bad influence of the Gunn Effect. As shown in FIG. 5, the MESFET 20 of FIG. 4 improves the minimum value Idosc of the saturated drain-source current in the Gunn oscillation region, from 2400 mA to 3400 mA.

Figure 7:
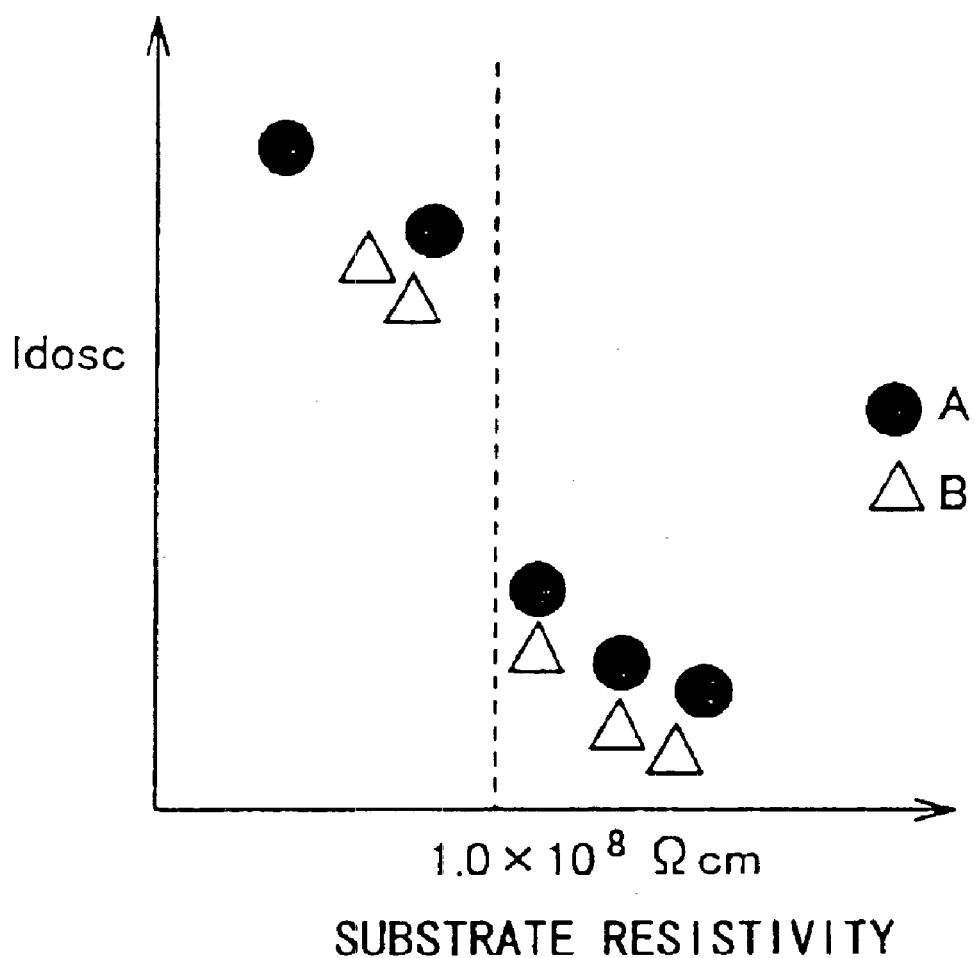
FIG. 7 shows the relationships between the minimum saturated drain-source current and substrate resistivities of the MESFET shown in FIG. 4.

FIG. 7 shows the minimum saturated drain-source current Idosc of the MESFET 20 of FIG. 4 while the resistivity of the GaAs substrate 21 is gradually varied. In the actual experiments done by the inventors, instead of varying the resistivity, a variety of GaAs substrates commercially available and having different resistivities were used to give the minimum saturated drain-source current Idosc.

Referring FIG. 7, the minimum saturated drain-source current Idosc increases when the resistivity of the substrate 21 is less than $1.0 \times 10^8$ Ohm-cm, and on the other hand the minimum saturated drain-source current Idosc decreases when the resistivity of the substrate 21 is more than $1.0 \times 10^8$ Ohm-cm. When the resistivity of the substrate 21 is much smaller, for example, less than $0.6 \times 10^8$ Ohm-cm, the minimum saturated drain-source current Idosc increases much more.

In this embodiment, it is preferable that the distance between the substrate 21 and the channel layer 23 be equal to or less than the distance between the gate electrode and drain electrode in the FET in order that the low resistance substrate 21 may effectively alleviate the electric field concentration. The distance between a gate electrode and a drain electrode in general FET devices is about 5 micrometers. Because the electrical field concentration generally occurs over a length corresponding to the above distance between two electrodes, the alleviation of the electric field concentration cannot be obtained when the distance between a low resistance substrate and a channel layer is greater than 5 micrometers.

Generally, a GaAs substrate can be manufactured by a method of pulling up its crystal from a liquid phase, such as the LEC method. During the process, natural lattice defects such as EL2 form donor levels in the GaAs crystal, and carbons from a graphite heater in a crystal growth apparatus form acceptor levels in the GaAs crystal, which constitutes a substrate. These reversal levels are compensated for to give a semi-insulating GaAs substrate in the prior art.

On the other hand, unintentional doping of the GaAs substrate by carbon should be inhibited when manufacturing a GaAs substrate 21 with a low resistivity according to the present invention.

Figure 8:
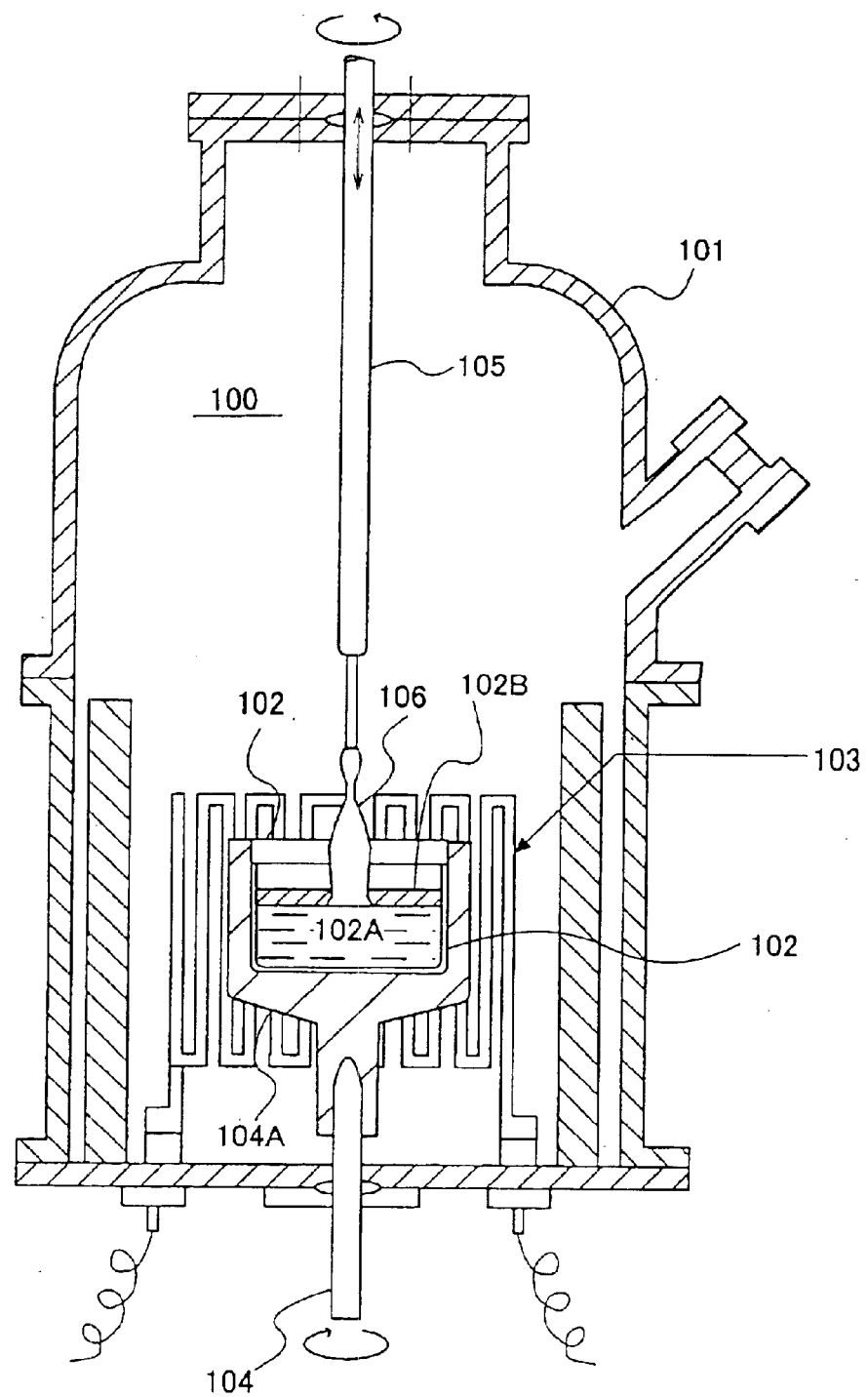
FIG. 8 is a cross-sectional view showing the construction of a crystal growth apparatus for growing a low resistance GaAs substrate.

FIG. 8 shows a substrate growth apparatus 100 used for manufacturing a GaAs substrate with a low resistivity by the LEC method.

Referring FIG. 8, the substrate growth apparatus 100 has a crucible 102 containing molten GaAs 102A in a pressure chamber 101. In the crucible 102 is provided a lid 102B made of $B_2O_3$ covering the surface of the molten GaAs 102A, in order to restrain the dissociation and vaporization of As.

A graphite heater 103 is mounted within the pressure chamber 101. The crucible 102 is supported in a holder 104A that is mounted on a rod 104 movable upward and downward. A correctly oriented seed crystal attached at the tip of a pulling-up rod 105 is partly immersed in the molten GaAs 102A. The pulling-up rod 105 is rotated and slowly pulled up, and a GaAs ingot 106 is grown following the seed crystal.

In this embodiment, a surface of the graphite heater 103 is covered with Boron Nitride film, which avoids the problem of vaporized carbon being introduced in the molten GaAs 102A and then in the ingot 106.

Second Embodiment

Figure 9:
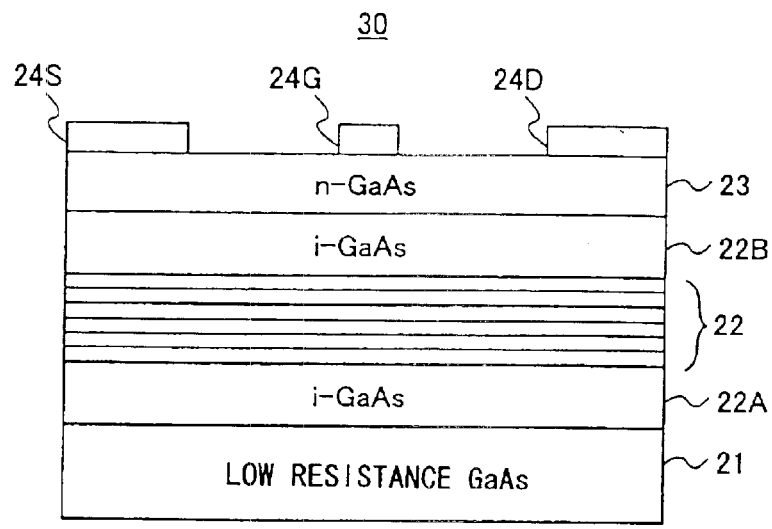
FIG. 9 is a cross-sectional view showing the construction of a MESFET device according to a second embodiment of the present invention.

FIG. 9 shows the construction of a MESFET 30 according to a second embodiment of the present invention. Those parts corresponding to the parts described previously are designated by the same reference numerals and the description thereof will be omitted.

Referring to FIG. 9, the MESFET 30 has an undoped GaAs buffer layer 22A formed on a low resistance GaAs substrate 21. A GaAs/AlGaAs super lattice structure 22 is formed on the undoped GaAs buffer layer 22A. Another undoped GaAs buffer layer 22B is formed on the super lattice structure 22. A channel layer or an active layer 23 is formed on the undoped GaAs buffer layer 22B.

Also in this structure, it is possible to inhibit electrons from leaking to the interface between the substrate 21 and the undoped GaAs buffer layer 22A by the GaAs/AlGaAs super lattice structure 22 being interposed between the substrate 21 and the channel layer 23. As a result, the domain generation and Gunn oscillation under high power conditions can be avoided, as in the MESFET 20 shown in FIG. 4.

Figure 10:
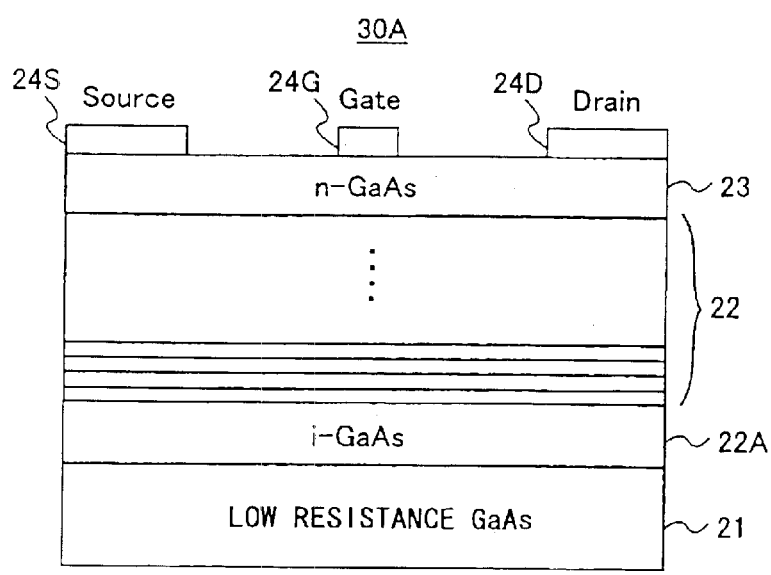
FIG. 10 shows an alternative embodiment similar to the MESFET shown in FIG. 9.

FIG. 10 shows the construction of a MESFET device 30A according to an alternative embodiment, which omits the GaAs buffer layer 22B in the MESFET 30 shown in FIG. 9. In this embodiment, the channel layer 23 is formed directly on the GaAs/AlGaAs super lattice structure 22.

The MESFET 30A can also avoid the problem of the domain generation and the Gunn oscillation under high power conditions, as in the MESFET 30 of FIG. 9, because the GaAs/AlGaAs super lattice structure 22 is interposed between the low resistance GaAs substrate 21 and the channel layer 23.

Figure 11:
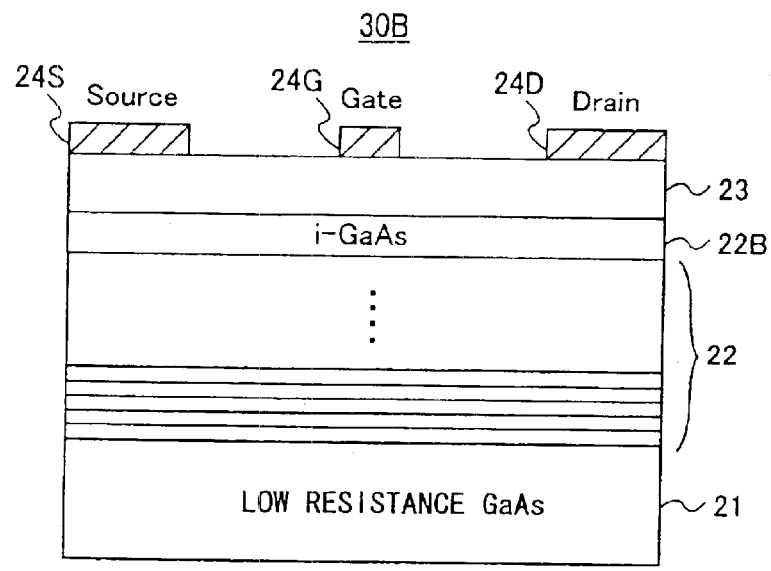
FIG. 11 shows another alternative embodiment similar to the MESFET shown in FIG. 9.

FIG. 11 shows the construction of a MESFET device 30B according to a further alternative embodiment, which omits the undoped GaAs layer 22A shown in FIG. 9, resulting in the GaAs/AlGaAs super lattice structure 22 being formed directly on the low resistance GaAs substrate 21.

The MESFET 30B can also avoid the problem of the domain generation and the Gunn oscillation under high power conditions, as in the MESFET 30 of FIG. 9, because the GaAs/AlGaAs super lattice structure 22 is interposed between the low resistance GaAs substrate 21 and the channel layer 23.

Third Embodiment

Figure 12:
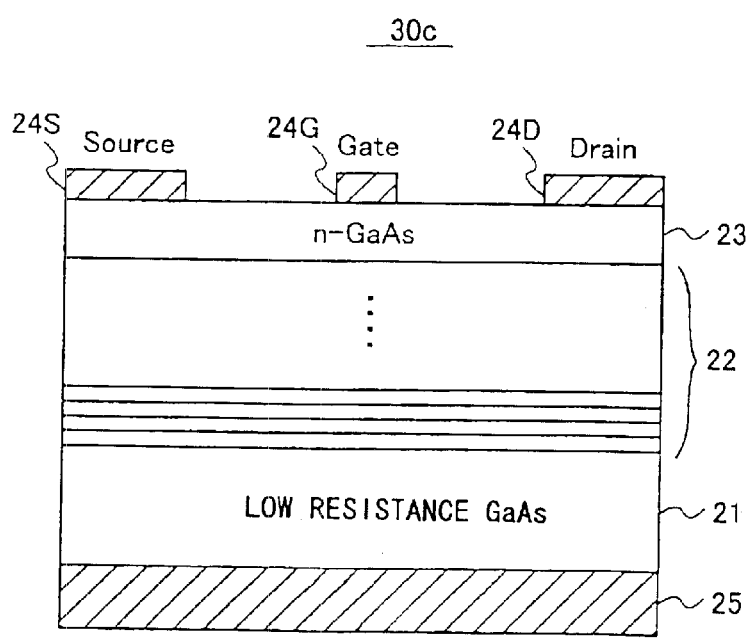
FIG. 12 is a cross-sectional view showing the construction of a MESFET device according to a third embodiment of the present invention.

FIG. 12 shows the construction of a MESFET 30C according to a third embodiment of the present invention. Those parts corresponding to the parts described previously are designated by the same reference numerals and the description thereof will be omitted.

Referring FIG. 12, the MESFET 30C has a construction similar to that of the MESFET 20 shown in FIG. 4, but is different in that it has an electrode layer 25 metalized on the bottom surface of the low resistance GaAs substrate 21. The electrode layer 25 can be used as a grounding electrode or a heat sink. Alternatively, the MESFET 30C can be brazed to an external heat sink via the electrode layer 25.

This electrode layer 25 in ohmic contact with the bottom surface of the substrate 21 can also alleviate the electric field problem in the substrate 21. In this embodiment, it is preferable that the thickness of the substrate 21 be equal to or less than 5 micrometers, which approximately equals the distance between the gate electrode 24G and the drain electrode 24D, so that the electrode layer 25 is close enough to the channel layer 23. A conductor which is in Schottky contact with the substrate 21 can be used instead of the ohmic electrode layer 25, as long as its potential barrier is low enough.

Figure 13:
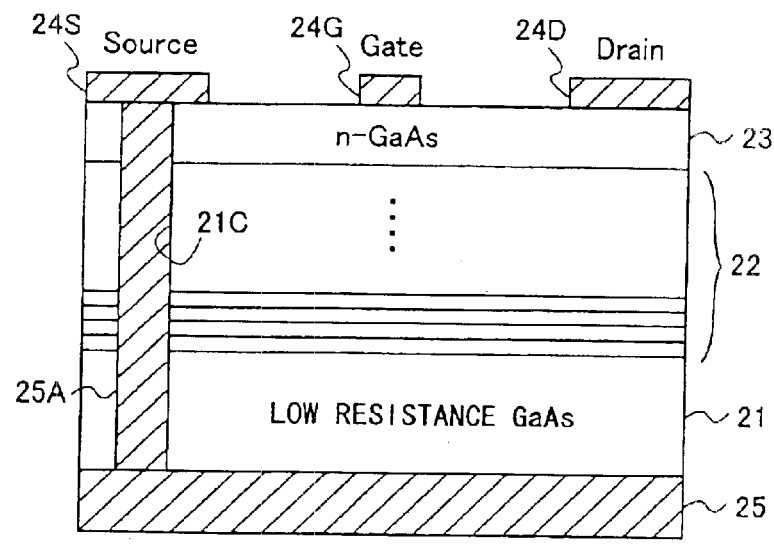
FIG. 13 shows an alternative embodiment similar to the MESFET shown in FIG 12.

The electrode layer 25 is not electrically connected to the channel layer 23 in the embodiment shown in FIG. 12. Alternatively, as shown in FIG. 13, a contact hall 21C may be opened through the super lattice buffer layer 22 and the channel layer 23, and the electrode layer 25 may be electrically connected to the source electrode 24S via a conducting plug 25A formed in the contact hall 21C.

Fourth Embodiment

Figure 14:
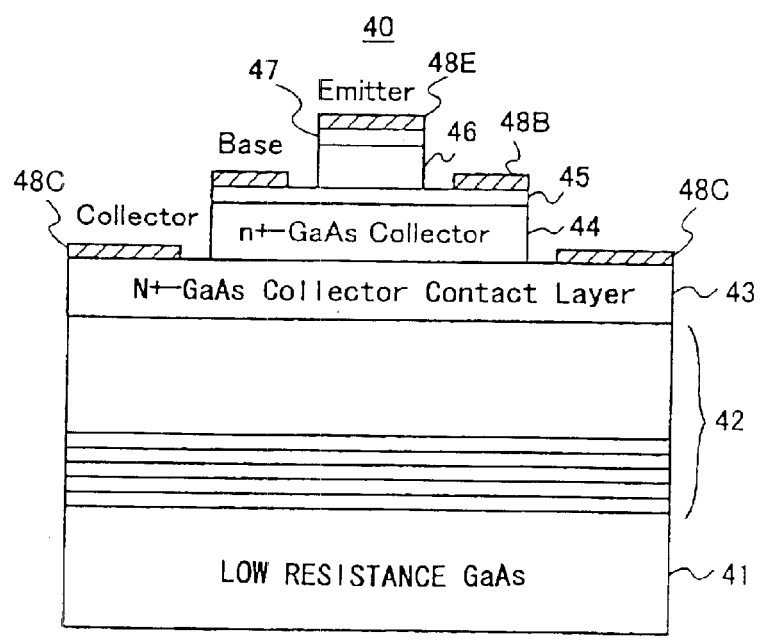
FIG. 14 is a cross-sectional view showing the construction of a HBT device according to a fourth embodiment of the present invention.

FIG. 14 shows the construction of a HBT 40 according to a fourth embodiment of the present invention.

Referring FIG. 14, the HBT 40 is formed on a low resistance GaAs substrate 41 having a resistivity less than $1.0 \times 10^8$ Ohm-cm. The HBT 40 includes a GaAs/AlGaAs super lattice buffer 42 formed on the GaAs substrate 41. The super lattice buffer 42 is made by laminating undoped GaAs layers and undoped AlGaAs layers alternatingly. The HBT 40 further includes an n$^+$-type GaAs collector contact layer 43 formed epitaxially on the super buffer layer 42, an n-type GaAs collector layer 44 having a first mesa structure and formed epitaxially on the collector contact layer 43, a p-type GaAs base layer 45 formed epitaxially on the collector layer 44, an n-type AlGaAs wide gap emitter layer 46 having a second mesa structure and formed epitaxially on the base layer 45, and an n$^+$-type GaAs emitter contact layer 47 formed epitaxially on the emitter layer 46. An n-type ohmic collector electrode 48C is formed on the collector contact layer 43, and a p-type ohmic emitter electrode 48E is formed on the emitter layer 47.

The HBT 40 can also inhibit the Gunn oscillation under high power condition, because the GaAs/AlGaAs super lattice buffer layer 42 is interposed between the low resistance GaAs substrate 41 and the collector contact layer 43.

Fifth Embodiment

Figure 15:
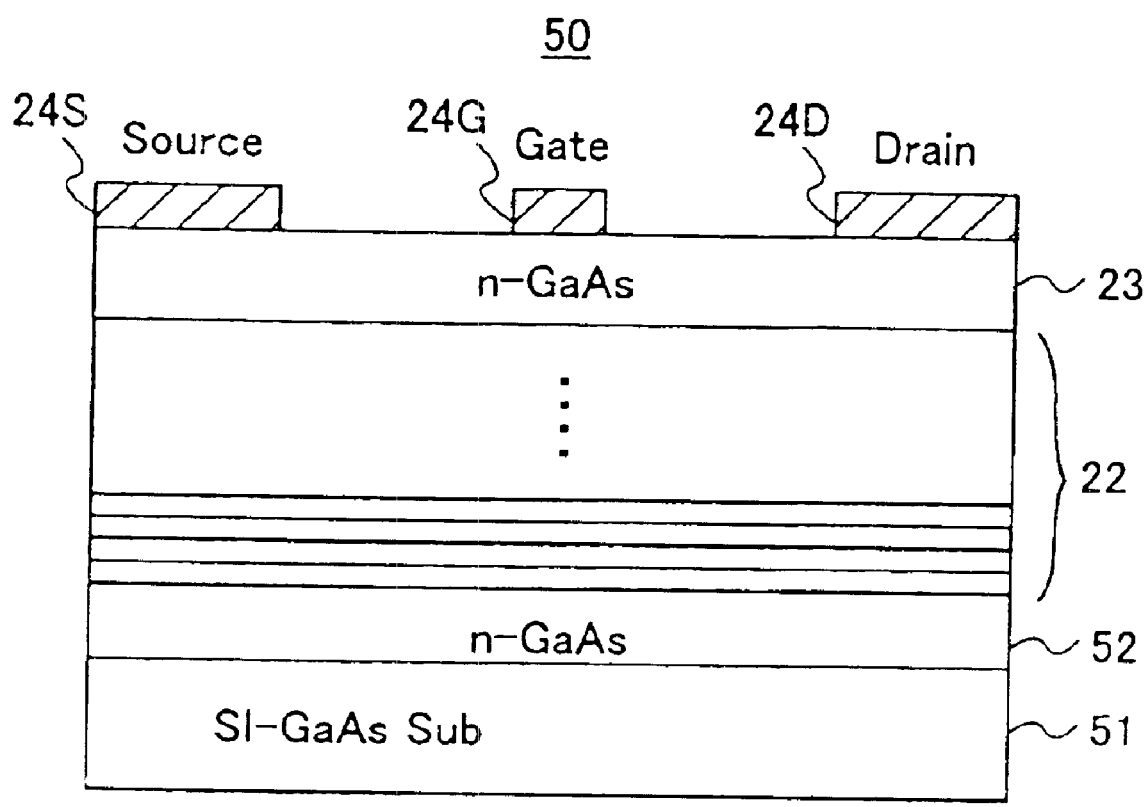
FIG. 15 is a cross-sectional view showing the construction of a MESFET device according to a fifth embodiment of the present invention.

FIG. 15 shows the construction of a MESFET 50 according to a fifth embodiment of the present invention. Those parts corresponding to the parts described previously are designated by the same reference numerals and the description thereof will be omitted.

Referring FIG. 15, the MESFET 50 has a construction similar to that of the MESFET 30, but is different in that it includes an n$^-$-type GaAs buffer layer 52 having a carrier concentration high enough to alleviate electrical fields, instead of a high resistance GaAs buffer 22A. In this embodiment, because the electric field is alleviated in the buffer layer 52, a high resistance GaAs substrate 51 having a resistivity more than $1.0 \times 10^8$ Ohm-cm can be used instead of the low resistance GaAs substrate 21.

The MESFET 50 was also found to avoid the problem of the domain generation and the Gunn oscillation under high power conditions, because the GaAs/AlGaAs super lattice buffer layer 22 is interposed between the substrate 51 and the channel layer 23 and the n$^-$-type GaAs buffer layer 52 is interposed between the buffer layer 22 and substrate 51.

In this embodiment, a carrier concentration required for the buffer layer 52 varies depending on the thickness of the layer 52. The carrier concentration is preferably more than $1 \times 10^{16}$ cm$^{-3}$ when the buffer layer 52 has a thickness of 300 nm, and preferably more than $1 \times 10^{15}$ cm$^{-3}$ when the buffer layer has a thickness of 1 micrometer. If the buffer layer 52 is too thick in this embodiment shown in FIG. 15, it causes a problem in that a leak current passing through the buffer layer 52 increases. Therefore, the thickness of the buffer layer 52 is limited within the above range in order that the layer 52 is depleted during the operation of the MESFET 50.

Although the above explanations were made using MESFET and HBT devices, the present invention is not limited to specific compound semiconductor devices and can be applied to other types of semiconductor devices including HEMT.

Further, although the above explanations were made using compound semiconductor devices formed on a GaAs substrate, the present invention can be applied to other types of compound semiconductor substrates such as one including InP, and the super lattice buffer layer 22 and the GaAs/AlGaAs super lattice barrier layer can still be used.

Further, the present invention is not limited to the embodiments described heretofore but various variations and modifications may be made without departing from the scope of the invention.

In a semiconductor device according to the present invention as set forth above, it becomes possible to alleviate an electric field concentration problem in a channel layer of the device under high power operating conditions, by employing a compound semiconductor substrate having a low resistivity at least in a surface area. Further, by interposing a high resistance buffer layer having a super lattice structure between the channel layer and the substrate, it becomes possible to inhibit electron leakage from the channel layer to the interface between the substrate and the buffer layer and restrain the leaking electrons accumulating at the interface. Further, it becomes possible to effectively restrain the domain generation in the buffer layer under high power electrical field conditions, by having such a super lattice structure in the buffer layer.

What is claimed is:

1. A high power semiconductor device for a radio communication system, comprising:
   a compound semiconductor substrate having a resistivity less than $1.0 \times 10^8$ Ohm-cm at least at a surface thereof;
   a buffer layer formed on the compound semiconductor substrate and having a super lattice structure; and
   an active layer formed on the buffer layer and having a high power active element for radio communication formed therein, wherein said substrate, buffer layer and active layer, together form said high power semiconductor device.

2. The semiconductor device as claimed in claim 1, wherein the compound semiconductor substrate has a resistivity less than $0.6 \times 10^8$ Ohm-cm.

3. The semiconductor device as claimed in claim 1, wherein the active layer is formed at a position within 5.0 $\mu$m from the surface of the compound semiconductor substrate.

4. The semiconductor device as claimed in claim 1, further comprising an electrode layer formed on another surface of the compound semiconductor substrate.

5. The semiconductor device as claimed in claim 4, wherein the electrode layer is not electrically connected to any power supply potential of the semiconductor device.

6. The semiconductor device as claimed in claim 4, wherein the electrode layer is connected to one power supply potential of the semiconductor device.

7. The semiconductor device as claimed in claim 1, further comprising:
a source electrode and a drain electrode formed on the active layer, separated from each other so as to establish a channel region, and
a gate electrode formed above the channel region.

8. The semiconductor device as claimed in claim 7, wherein the active layer has 2-Dimensional Electron Gasses.

9. The semiconductor device as claimed in claim 1, wherein the buffer layer has a GaAs/Al GaAs supper lattice structure.

10. The semiconductor device as claimed in claim 9, wherein the GaAs/AlGaAs super lattice structure includes undoped AlGaAs layers have a carrier concentration less than $1 \times 10^{16}$ cm$^{-3}$.

11. The semiconductor device as claimed in claim 1, wherein the GaAs/Al GaAs super lattice structure includes undoped GaAs layers having a carrier concentration less than $1 \times 10^5$ cm$^{-3}$.

12. The semiconductor device as claimed in claim 1, wherein the active layer is doped with is to a concentration of $1 \times 10^{17}$ cm$^{-3}$.

13. The semiconductor device as claimed in claim 1, wherein the compound semiconductor device substrate is a GaAs substrate.

14. The semiconductor device as claimed in claim 1, wherein the super lattice buffer layer is configured sufficient to inhibit electrical field concentration in the active layer upon activation of the semiconductor device.

15. The semiconductor device as claimed in claim 1, wherein the super lattice buffer layer is configured sufficient to inhibit accumulation, at the interface between the low-resistance substrate layer and the buffer layer, of electrons leaking from the active layer.

16. The semiconductor device as claimed in claim 1, wherein the super lattice buffer layer is configured sufficient to inhibit domain generation in the buffer layer under high power operating conditions, upon activation of the semiconductor device.

17. A high power semiconductor device for a radio communication system, comprising:
a compound semiconductor substrate having a resistivity less than $1.0 \times 10^8$ Ohm-cm at least at a surface thereof;
a buffer layer formed on the compound semiconductor substrate and having a super lattice structure; and
an active layer formed on the buffer layer and having a high power active element formed therein,
wherein the compound semiconductor substrate has a resistivity of more than $1.0 \times 10^8$ Ohm-cm in total, and wherein said substrate, buffer layer and active layer, together form said high power semiconductor device.

18. The semiconductor device as claimed in claim 17, wherein the buffer layer has a GaAs/AlGaAs super lattice structure.

19. The semiconductor device as claimed in claim 18, wherein the GaAs/AlGaAs super lattice structure includes undoped GaAs layers having a carrier concentration less than $1 \times 10^{15}$ cm$^{-3}$.

20. The semiconductor device as claims in claim 18, wherein the GaAs/AlGaAs super lattice structure includes undoped AlGaAs layers having a carrier concentration less than $1 \times 10^{16}$ cm$^{-3}$.

21. The semiconductor device as claimed in claim 17, wherein the active layer is doped with Is to a concentration of $1 \times 10^{17}$ cm$^{-3}$.

22. The semiconductor device as claimed in claim 17, wherein the compound semiconductor device substrate is a GaAs substrate.

23. The semiconductor device as claimed in claim 17, wherein the super lattice buffer layer is configured sufficient to inhibit electrical field concentration in the active layer upon activation of the semiconductor device.

24. The semiconductor device as claimed in claim 17, wherein the super lattice buffer layer is configured sufficient to inhibit accumulation, at the interface between the low-resistance substrate layer and the buffer layer, of electrons leaking from the active layer.

25. The semiconductor device as claimed in claim 17, wherein the super buffer layer is configured sufficient to inhibit domain generation in the buffer layer under high power operating conditions, upon activation of the semiconductor device.

26. The semiconductor device as claimed in claim 17, wherein said compound semiconductor substrate comprises:
a support substrate layer having a resistivity of more than $1.0 \times 10^8$ Ohm-cm, and a substrate surface layer provided on said support substrate layer having a resistivity of less than $1.0 \times 10^8$ Ohm-cm.

* * * * *